(12) United States Patent
Chen et al.

(10) Patent No.: US 8,223,545 B1
(45) Date of Patent: Jul. 17, 2012

(54) SYSTEMS AND METHODS FOR DATA PAGE MANAGEMENT OF NAND FLASH MEMORY ARRANGEMENTS

(75) Inventors: Liang-Chieh Chen, Milpitas, CA (US); Xueshi Yang, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 336 days.

(21) Appl. No.: 12/611,837

(22) Filed: Nov. 3, 2009

Related U.S. Application Data

(60) Provisional application No. 61/113,431, filed on Nov. 11, 2008.

(51) Int. Cl.
*G11C 11/34* (2006.01)

(52) U.S. Cl. .............................. 365/185.05; 365/185.24

(58) Field of Classification Search ............. 365/185.05, 365/185.24
See application file for complete search history.

(56) References Cited

U.S. PATENT DOCUMENTS

| 2009/0003077 A1* | 1/2009 | Lim ......................... 365/185.21 |
| 2009/0231916 A1* | 9/2009 | Kim et al. ................ 365/185.05 |

* cited by examiner

*Primary Examiner* — Michael Tran

(57) ABSTRACT

Embodiments of the present disclosure provide methods and apparatus for providing a NAND flash memory arrangement that comprises a source select line (SSL), a drain select line (DSL) and a plurality of NAND memory cells arranged to provide a plurality of data pages. The method further includes defining a first set of data pages in close proximity to the SSL, defining a second set of data pages in close proximity to the DSL, and differentiating the first set of data pages and the second set of data pages from at least the remaining data pages.

12 Claims, 4 Drawing Sheets

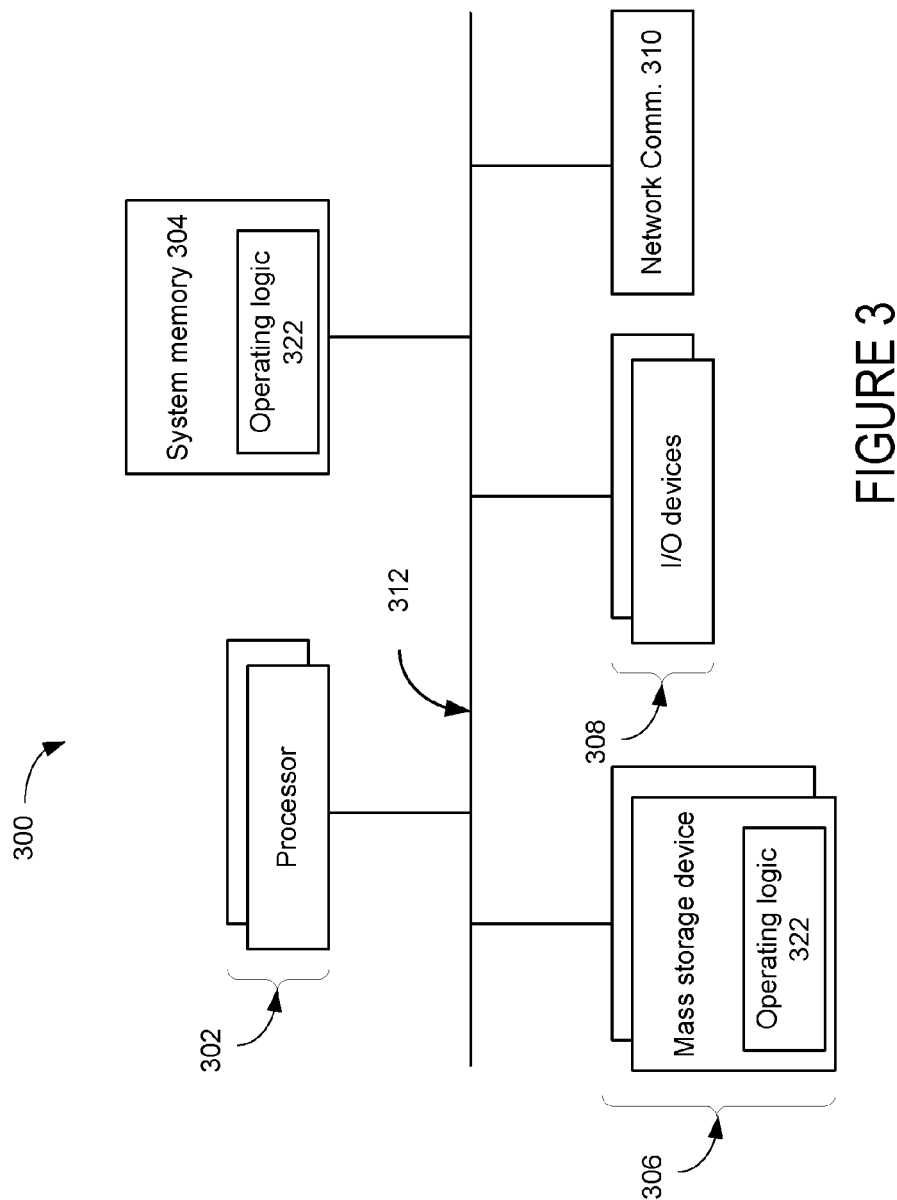

US 8,223,545 B1

SYSTEMS AND METHODS FOR DATA PAGE MANAGEMENT OF NAND FLASH MEMORY ARRANGEMENTS

CROSS REFERENCE TO RELATED APPLICATIONS

The present application claims priority to U.S. Provisional Patent Application No. 61/113,431, filed Nov. 11, 2008, the entire specification of which is hereby incorporated by reference in its entirety for all purposes, except for those sections, if any, that are inconsistent with this specification.

TECHNICAL FIELD

Embodiments of the present disclosure relate to memory devices, and more particularly, to NAND flash memory devices.

BACKGROUND

Flash memories are widely used in numerous applications. The conventional flash memory permits a group of memory cells to be simultaneously programmed (e.g., written) and/or erased through a single operation. Generally, data can be written to and/or erased from a memory cell a finite number of times. Flash memories usually store data in individual memory cells, and the memory cells generally are made up of floating-gate transistors. In a single-level cell (SLC) flash memory, one bit of data is stored in each cell. A multi-level cell (MLC) flash memory, on the other hand, stores more than one bit of data in each cell, with the multi-level referring to the multiple levels of electrical charge used to store multiple bits per memory cell. Flash memory arrangements can be made up of one or both types of cells.

When cycling (programming and erasing, repeatedly) is performed within a NAND flash memory architecture, it has been determined that errors occur more frequently in the data pages closest to a source select line (SSL) and the data pages closest to a drain select line (DSL). Likewise, errors from baking (data retention) also tend to occur more frequently in the data pages closest to the SSL and the DSL. This is generally due to voltage disturbances and stress that are provided by the SSL and the DSL.

The description in this section is related art, and does not necessarily include information disclosed under 37 C.F.R. 1.97 and 37 C.F.R. 1.98. Unless specifically denoted as prior art, it is not admitted that any description of related art is prior art.

SUMMARY

The present disclosure provides a method comprising providing a NAND flash memory arrangement that comprises a source select line (SSL), a drain select line (DSL) and a plurality of NAND memory cells arranged to provide a plurality of data pages. The method further includes defining a first set of data pages in close proximity to the SSL, defining a second set of data pages in close proximity to the DSL, and differentiating the first set of data pages and the second set of data pages from at least the remaining data pages.

In accordance with various embodiments, the first set of data pages comprises 6 data pages in closest proximity to the SSL and the second set of data pages comprises 6 data pages in closest proximity to the DSL.

In accordance with various embodiments, the differentiating comprises at least one of downgrading NAND memory cell usage, using different error correcting code, using different data compression, using weighted wear leveling, and using different data page utilization scheduling.

In accordance with various embodiments, the differentiating comprises using multi-level NAND memory cells as single level cells for the first set of data pages and the second set of data pages, and using multi-level NAND memory cells as multi-level cells for the remaining data pages.

In accordance with various embodiments, using multi-level charge NAND memory cells as single level cells for the first set of data pages and the second set of data pages occurs after using the multi-level NAND memory cells as multi-level cells for a predetermined number of programming and erase cycles.

In accordance with various embodiments, the differentiating comprises using only some of the first set of data pages and the second set of data pages for storing data.

The present invention also provides an apparatus comprising a NAND flash memory arrangement comprising a source select line (SSL), a drain select line (DSL), and a plurality of NAND memory cells arranged to provide a plurality of data pages. A first set of data pages in close proximity to the SSL and a second set of data pages in close proximity to the DSL are differentiated from at least the remaining data pages.

In accordance with various embodiments, the first set of data pages comprises 6 data pages in closest proximity to the SSL and the second set of data pages comprises 6 data pages in closest proximity to the DSL.

In accordance with various embodiments, the first set of data pages in close proximity to the SSL and the second set of data pages in close proximity to the SSL are differentiated by at least one of downgrading NAND memory cell usage, using different error correcting code, using different data compression, using weighted wear leveling, and using different data page utilization scheduling.

In accordance with various embodiments, the first set of data pages in close proximity to the SSL and the second set of data pages in close proximity to the SSL are differentiated by configuring multi-level NAND memory cells for use as single level cells for the first set of data pages and the second set of data pages, and configuring multi-level NAND memory cells as multi-level cells for the remaining data pages.

In accordance with various embodiments, the multi-level charge NAND memory cells are configured to be used as single level cells for the first set of data pages and the second set of data pages after using the multi-level NAND memory cells as multi-level charge cells for a predetermined number of programming and erase cycles.

In accordance with various embodiments, the first set of data pages in close proximity to the SSL and the second set of data pages in close proximity to the DSL are differentiated by using only some of the first set of data pages and the second set of data pages.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

FIG. 3 is a block diagram of an exemplary system.

DETAILED DESCRIPTION

Embodiments of the present disclosure describe a location aware data page management for NAND flash memory based storage systems. In the following detailed description, reference is made to the accompanying drawings which form a part hereof, wherein like numerals designate like parts throughout. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

The description uses perspective-based descriptions such as up/down, back/front, over/under, and top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 1A:
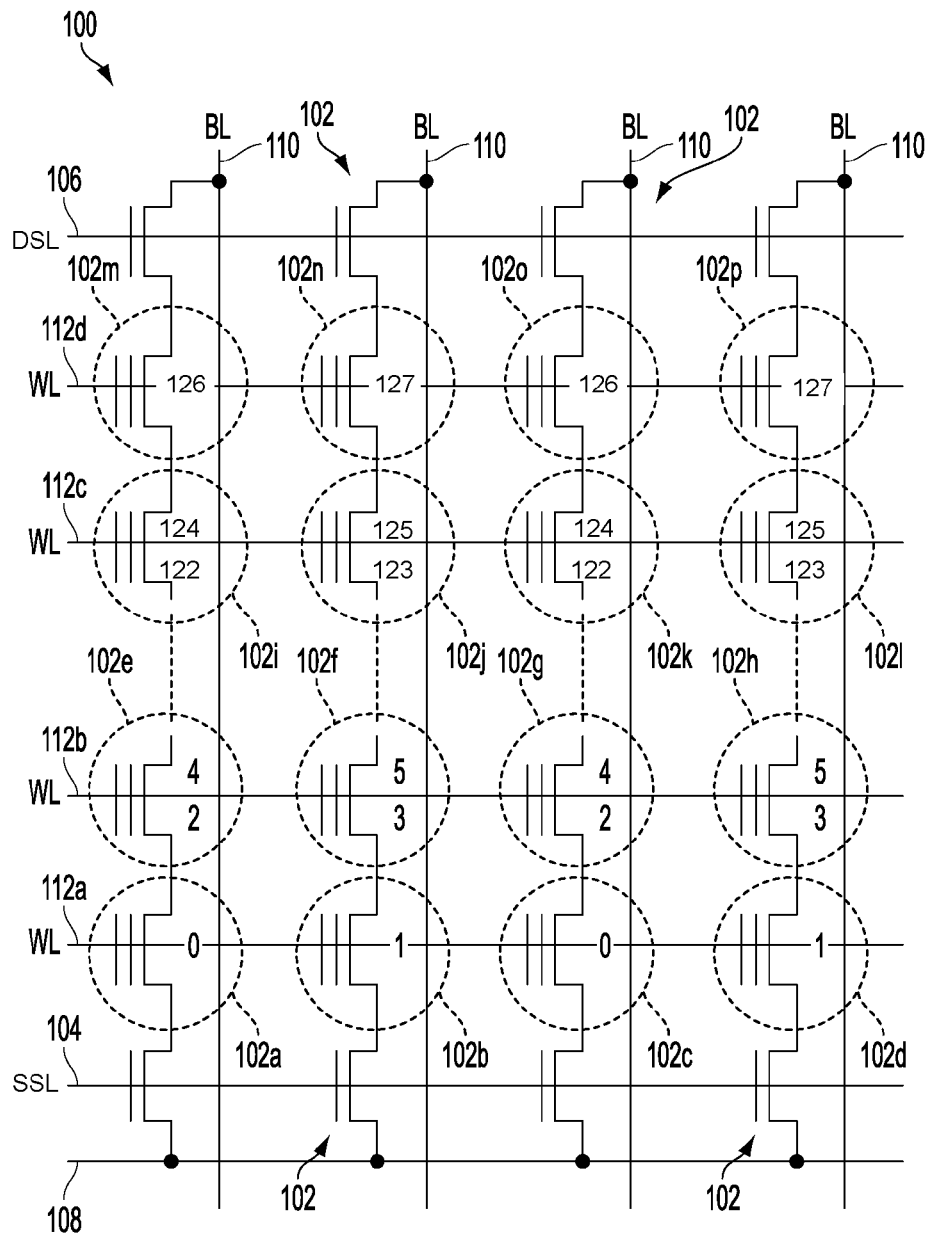
FIG. 1A is a schematic illustration of a NAND flash memory arrangement.

FIG. 1A illustrates an example of a Not-And (NAND) flash memory arrangement 100. The NAND flash memory arrangement 100 includes a plurality of NAND memory cells 102 in the form of floating-gate transistors arranged in a NAND cell string structure. The NAND flash memory arrangement 100 also includes a source select line (SSL) 104 and a drain select line (DSL) 106, as well as a ground line 108. The NAND flash memory arrangement 100 also includes a plurality of bit lines 110 and word lines 112.

In the exemplary NAND flash memory arrangement 100 of FIG. 1A, the NAND memory cells 102 arranged along the word lines 112 generally provide data pages, where each data page corresponds to a bit plane. Thus, the NAND memory cells 102a,b,c,d along the word line 112a closest to the SSL 104 provide data page 0 and data page 1 and the NAND memory cells 102e,f,g,h along the next word line 112b provide data pages 2, 3, 4 and 5. More particularly, NAND memory cells 102a and 102c provide data page 0 and NAND memory cells 102b and 102d provide data page 1. NAND memory cells 102e and 102g provide data pages 2 and 4, while NAND memory cells 102f and 102h provide data pages 3 and 5. Since the exemplary arrangement of FIG. 1A is a 128-page arrangement, the NAND memory cells 102m,n,o,p arranged along the word line 112d closest to the DSL 106 provide data pages 126 and 127, while the NAND memory cells 102i,j,k,l arranged along the next word line 112c provide data pages 122, 123, 124 and 125. More particularly, NAND memory cells 102m and 102o provide data page 126 and NAND memory cells 102n and 102p provide data page 127. NAND memory cells 102i and 102k provide data pages 122 and 124, while NAND memory cells 102j and 102l provide data pages 123 and 125.

In the exemplary arrangement of FIG. 1A, the NAND memory cells 102 along word lines 112a and 112d are SLC flash memory cells. The NAND memory cells 102 along the word lines 112 in between word lines 112a and 112d are MLC flash memory cells. The SLC flash memory cells each provide one bit for data storage for a data page, while the MLC flash memory cells, in this example, each provide two bits of memory storage for two data pages.

The NAND flash memory arrangement 100 of FIG. 1A can include fewer or more data pages. Likewise, more NAND memory cells 102 may be included along the bit lines 110 and word lines 112 to provide larger data pages. As is known, programming and reading from the various NAND memory cells 102 is achieved through activation of the bit lines 110, the DSL 106, the word lines 112, and the SSL 104.

Figure 2:
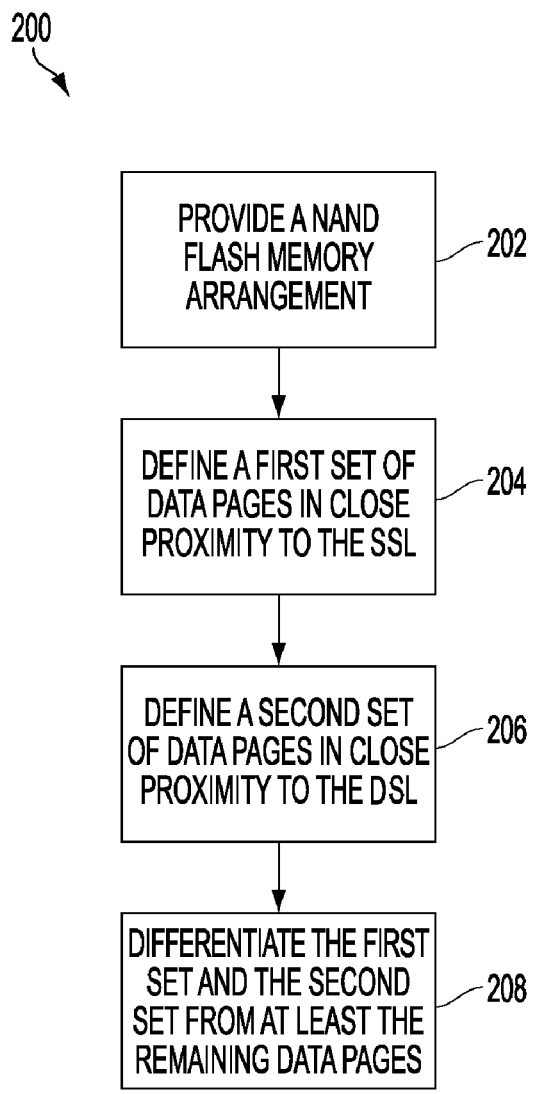
FIG. 2 is a flowchart depicting a method of managing data pages within the flash memory arrangement of FIG. 1.

FIG. 2 illustrates a method 200 for reducing the likelihood of errors within data pages that are in close proximity to either the SSL 104 or the DSL 106. At 202, a NAND flash memory arrangement 100 that includes the SSL 104, the DSL 106 and a plurality of NAND memory cells 102 arranged to provide a plurality of data pages is provided. At 202, a first set of data pages is defined that is in close proximity to the SSL 104. The first set of data pages may include one or more data pages. At 204, a second set of data pages is defined that is in close proximity to DSL 106. The second set of data pages may include one or more data pages. At 206, the first set of data pages and the second set of data pages are differentiated from at least the remaining data pages of the plurality of data pages. In accordance with various embodiments of the present disclosure, the first set of data pages includes the six data pages that are closest in proximity, i.e., nearest, to the SSL 104, while the second set of data pages includes the six data pages that are closest in proximity, i.e., nearest, to the DSL 106. In such embodiments, the first set of data pages is provided by word lines 112a,b and the second set of data pages is provided by word lines 112c,d as illustrated in FIG. 1A. As previously mentioned, it has been determined that errors occur more frequently in the data pages closest to a source select line (SSL) and the data pages closest to a drain select line (DSL)

The first set of data pages and the second set of data pages can be differentiated through a variety of techniques. These techniques include cell downgrading, differentiated error correcting code (ECC), different data compression, weighted wear leveling, and different data page utilization scheduling.

Figure 1B:
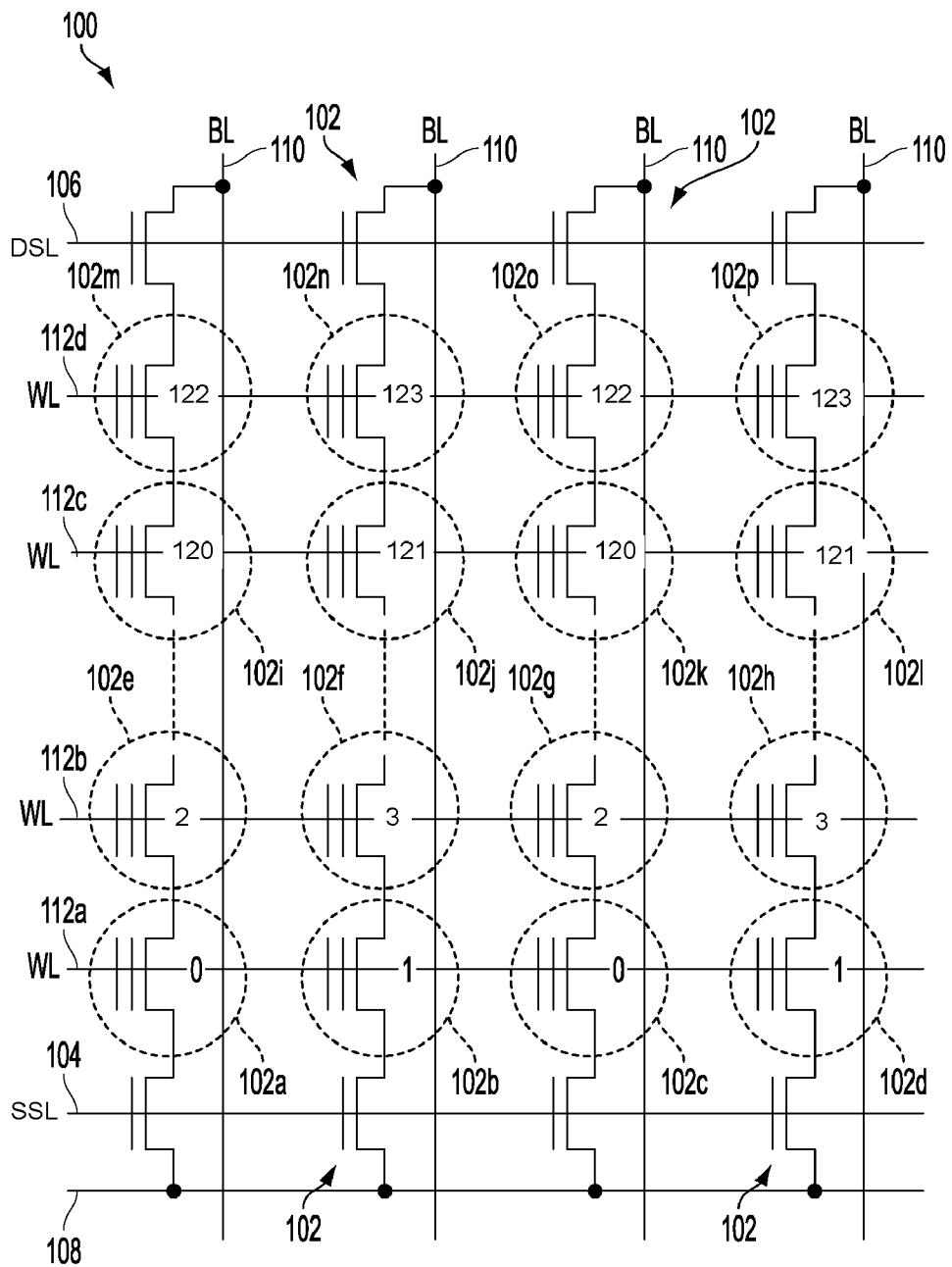
FIG. 1B is a schematic illustration of another NAND flash memory arrangement.

Downgrading NAND cell usage within the data pages in close proximity to the SSL 104 and the DSL 106 includes downgrading the NAND flash memory arrangement 100 such that word line 112b is made up of SLC memory cells instead of MLC memory cells. As may be seen in FIG. 1B, in such an arrangement word line 112b provides data pages 2 and 3, while word line 112a provides data pages 0 and 1. Thus, another word line of SLC memory cells would need to be added to the NAND flash memory arrangement 100 to make up for the two lost data pages, if desired. Likewise, word line 112c is also made up of SLC memory cells as opposed to MLC memory cells. As may be seen in FIG. 1B, in such an arrangement word line 112c provides data pages 120 and 121, while word line 112d provides data pages 122 and 123. Accordingly, another word line would also need to be added to the NAND flash memory arrangement 100 to make up for the two lost data pages from using SLC memory cells along word line 112c as opposed to MLC memory cells, if desired. Thus, one additional word line made up of MLC memory cells can be added in between word lines 112b and 112c in order to make up for the four lost data pages. Alternatively, no word lines are added to the NAND flash memory arrangement 100 and arrangement 100 is simply operated with only 124 data pages as opposed to the 128 data pages illustrated in FIG. 1A. In the exemplary embodiment of FIG. 1B, the word lines (not illustrated) in between word line 112b and 112c are made up of MLC memory cells configured as illustrated for word lines 112b and 112c in FIG. 1A.

Alternatively, word lines 112b and 112c can still be made up of MLC memory cells. However, after a predetermined number of cycling operations have been performed, the MLC memory cells of word lines 112b and 112c can be downgraded and operated as SLC memory cells. In such an arrangement, 4 data pages (2 from word line 112b and 2 from word line 112c) are lost after the downgrading.

Another form of downgrading can be realized with certain data pages not being used at all for storing data. For example, data pages 1, 2 and 4 of memory cells 102b,d,e,g are not programmed at all, while data pages 0, 3 and 5 of memory cells 102a,c,f,h are used for programming. With such an arrangement, the roles of the data pages can be reversed after a predetermined number of cycling operations has occurred. Thus, data pages 1, 2 and 4 can be programmed and data pages 0, 3 and 5 are not programmed after a predetermined number of cycling operations has occurred using data pages 0, 3 and 5. By not using some of the data pages, coupling interference can be reduced.

The word lines 112a,d to the SSL 104 and the DSL 106, respectively, can also be differentiated from other data pages by providing more redundancy. Thus, different or stronger ECC can be used when programming data pages within close proximity to either the SSL 104 or the DSL 106. Examples of ECC include Reed-Solomon codes, turbo codes, BCH codes, Reed-Muller codes, Binary Golay codes, and low-density parity-check codes (LDPC).

Another technique for differentiating data pages in close proximity to the SSL 104 and DSL 106 includes manipulation of an internal packing scheme, which occurs after data programmed into one or more of data pages 0-4 and data pages 123-127 is compressed. With an internal packing scheme, the compressed data is packed into data pages. As an example, assume three data pages (page 0, page 1, page 2) are provided. The compression ratio of each data page is 0.2, 0.3, and 0.5, respectively. (0.2 indicates the size of data page 0, after compression, is reduced to 20% of its original size). If an internal packing scheme is applied, all the compressed data is packed into data page 0 (0.2+0.3+0.5=1) and the remaining space of data pages 1 and 2 are saved for future use. In accordance with various embodiments of the present disclosure, after compressing all the data, the internal packing scheme is not applied to the data pages close to the SSL 104 and the DSL 106, but the internal packing scheme is applied to the other data pages. Thus, in the present example, page 0 will be used to store compressed data, but only 20% of page 0's size is used, while the other 80% of page 0's size is unused. By using this type of technique with data pages 0-4 and 123-127, the usage of data pages 0-4 and 123-127 is reduced, thereby postponing wear-out of the data pages, which leads to more errors within the data pages.

Another technique for differentiating data pages in close proximity to the SSL 104 and the DSL 106 involves wear leveling. The goal of wear leveling is to spread out the programming and erase operation for the data pages across as much of the NAND memory cells 102 as possible. This wear leveling technique involves increasing a weighting factor for one or more of data pages 0-4 and data pages 123-127 each time that data page is programmed. As the data pages 0-4 and 123-127 are programmed to and read from, with an increased weighting factor, the wear leveling will be increased for such data pages in comparison to data pages that do not have a weighted wear leveling factor. Thus, when the data pages having a weighted wear leveling factor reach a predetermined threshold, which will occur quicker compared to the other data pages within arrangement 100 due to the weighted weighting factor, such data pages will be less frequently utilized (or not utilized at all in some embodiments) in order to help maintain data reliability.

Another technique of differentiating data pages in close proximity to the SSL 104 and the DSL 106 involves scheduling the use of one or more of the data pages 0-4 and 123-127 less often than other data pages within the flash memory arrangement 100 in order to reduce wear on the data pages. For example, for data pages 0-4 and data pages 123-127, firmware can utilize one or more of these data pages every other time after the data pages have been erased for programming instead of every time after the data pages have been erased. The schedule could be arbitrary or can involve a weighting factor of use in order to reduce use of one or more the data pages 0-4 and 123-127.

One or more of the previously described techniques for differentiation can be used in differentiating the data pages in close proximity to the SSL 104 and the DSL 106 from the other data pages within the flash memory arrangement 100. Likewise, the data pages closest to the DSL 106 can be differentiated with respect to the data pages closest to the SSL 104. For example, a different technique can be used for the data pages in close proximity to the SSL 104 than that which is used for the data pages in close proximity to the DSL 106. Additionally, multiple differentiation techniques can be utilized for data pages in close proximity to the SSL 104 and/or the DSL 106.

FIG. 3 is a block diagram of an exemplary system 300. As illustrated, system 300 includes one or more processors or processor cores 302, and system memory 304. For the purpose of this application, including the claims, the terms "processor" and "processor cores" may be considered synonymous, unless the context clearly requires otherwise. Additionally, system 300 includes one or more mass storage devices 306 (such as diskette, hard drive, compact disc read only memory (CDROM) and so forth), input/output devices 308 and communication interfaces 310 (such as network interface cards, modems and so forth). The elements of FIG. 3 are operatively coupled to each other via a system bus 312, which may represent one or more buses. In the case of multiple buses, the multiple buses may be bridged by one or more bus bridges (not illustrated).

Each of these elements performs its conventional functions known in the art. In particular, system memory 304 and mass storage 306 may be employed to store a working copy and a permanent copy of the programming instructions implementing all or a portion of earlier described functions, herein collectively denoted as 322. The instructions 322 may be assembler instructions supported by processor(s) 302 or instructions that can be compiled from high level languages, such as C.

The permanent copy of the programming instructions may be placed into permanent storage 306 in the factory, or in the field, through, for example, a distribution medium (not shown), such as a compact disc (CD), or through communication interface 310 (from a distribution server (not shown)). That is, one or more distribution media having instructions 322 may be employed to distribute the instructions 322 and program various client devices. The constitution of these elements 302-312 are generally well known, and accordingly will not be further described.

In an embodiment, the system memory 304 is similar to the NAND flash memory arrangement 100 discussed in this disclosure. Thus, the system memory 304 includes a plurality of NAND memory cells 102 in the form of floating-gate transistors arranged in a NAND cell string structure. The NAND flash memory arrangement includes a SSL 104 and a DSL 106, as well as a ground line 108. The NAND flash memory arrangement 100 also includes a plurality of bit lines 110 and word lines 112. The system memory 304 may include one or more other types of memory known in the art.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A method for managing a plurality of data pages in a NAND flash memory arrangement, wherein the NAND flash memory arrangement includes a source select line, a drain select line, and a plurality of NAND memory cells arranged to provide the plurality of data pages, the method comprising:
defining a first set of data pages of the plurality of data pages, wherein the first set of data pages is in close proximity to the source select line;
defining a second set of data pages of the plurality of data pages, wherein the second set of data pages is in close proximity to the drain select line; and
differentiating each of (i) the first set of data pages and (ii) the second set of data pages from at least the remaining data pages of the plurality of data pages, wherein differentiating each of i) the first set of data pages and (ii) the second set of data pages from at least the remaining data pages comprises at least one of
downgrading NAND memory cell usage,
using different error correcting code,
using different data compression,
using weighted wear leveling, and
using different data page utilization scheduling.

2. The method of claim 1, wherein:
the first set of data pages comprises 6 data pages in closest proximity to the source select line; and
the second set of data pages comprises 6 data pages in closest proximity to the drain select line.

3. The method of claim 1, wherein differentiating each of (i) the first set of data pages and (ii) the second set of data pages from at least the remaining data pages further comprises differentiating (i) the first set of data pages from (ii) the second set of data pages.

4. The method of claim 1, wherein:
the differentiating each of i) the first set of data pages and (ii) the second set of data pages from at least the remaining data pages further comprises using multi-level NAND memory cells as single level cells for (i) the first set of data pages and for (ii) the second set of data pages; and
using multi-level NAND memory cells as multi-level cells for the remaining data pages.

5. The method of claim 4, wherein using multi-level charge NAND memory cells as single level cells for (i) the first set of data pages and for (ii) the second set of data pages occurs after using the multi-level NAND memory cells as multi-level cells for a predetermined number of programming and erase cycles.

6. The method of claim 1, wherein differentiating each of (i) the first set of data pages and (ii) the second set of data pages from at least the remaining data pages further comprises using only some of (i) the first set of data pages and (ii) the second set of data pages for storing data.

7. An apparatus comprising:
a NAND flash memory arrangement comprising
a source select line,
a drain select line, and
a plurality of NAND memory cells arranged to provide a plurality of data pages,
wherein (i) a first set of data pages in close proximity to the SSL and (ii) a second set of data pages in close proximity to the DSL are differentiated from at least the remaining data pages,
wherein (i) the first set of data pages in close proximity to the SSL and (ii) the second set of data pages in close proximity to the drain select line are differentiated from at least the remaining data pages by at least one of
downgrading NAND memory cell usage,
using different error correcting code,
using different data compression,
using weighted wear leveling, and
using different data page utilization scheduling.

8. The apparatus of claim 7, wherein (i) the first set of data pages comprises 6 data pages in closest proximity to the SSL, and (ii) the second set of data pages comprises 6 data pages in closest proximity to the DSL.

9. The apparatus of claim 7, wherein the first set of data pages in close proximity to the SSL is differentiated from the second set of data pages in close proximity to the DSL.

10. The apparatus of claim 7, wherein the first set of data pages in close proximity to the SSL and the second set of data pages in close proximity to the DSL are further differentiated from at least the remaining data pages by
configuring multi-level NAND memory cells for use as single level cells for (i) the first set of data pages and for (ii) the second set of data pages, and
configuring multi-level NAND memory cells for use as multi-level cells for the remaining data pages.

11. The apparatus of claim 10, wherein the multi-level charge NAND memory cells are configured to be used as single level cells for (i) the first set of data pages and for (ii) the second set of data pages after using the multi-level NAND memory cells as multi-level charge cells for a predetermined number of programming and erase cycles.

12. The apparatus of claim 8, wherein (i) the first set of data pages in close proximity to the SSL and (ii) the second set of data pages in close proximity to the DSL are differentiated from at least the remaining data pages by using only some of the first set of data pages and the second set of data pages.

* * * * *